(12) United States Patent
Hu (10) Patent No.: US 11,991,909 B2
(45) Date of Patent: May 21, 2024

(54) DISPLAY BACKPLANE AND MOBILE TERMINAL

(71) Applicant: TCL CHINA STAR OPTOELECTRONICS TECHNOLOGY CO., LTD., Guangdong (CN)

(72) Inventor: Daobing Hu, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 444 days.

(21) Appl. No.: 17/436,619

(22) PCT Filed: Jul. 28, 2021

(86) PCT No.: PCT/CN2021/108794
§ 371 (c)(1),
(2) Date: Sep. 6, 2021

(87) PCT Pub. No.: WO2023/284009
PCT Pub. Date: Jan. 19, 2023

(65) Prior Publication Data
US 2023/0016095 A1    Jan. 19, 2023

(51) Int. Cl.
*H01L 23/00*    (2006.01)
*H10K 59/131*    (2023.01)

(52) U.S. Cl.
CPC ............... *H10K 59/131* (2023.02)

(58) Field of Classification Search
CPC ................................. H10K 59/131
See application file for complete search history.

(56) References Cited

U.S. PATENT DOCUMENTS

2014/0192102 A1    7/2014  Im

FOREIGN PATENT DOCUMENTS

| CN | 106531074 A | 3/2017 |
|----|-------------|--------|
| CN | 107657919 A | 2/2018 |
| CN | 108649059 A | 10/2018 |
| CN | 109584805 A | 4/2019 |
| CN | 109637409 A | 4/2019 |
| CN | 109637444 A | 4/2019 |
| CN | 110992878 A | 4/2020 |
| CN | 111028758 A | 4/2020 |
| CN | 112309331 A | 2/2021 |
| EP | 3648090 A1  | 5/2020 |
| WO | 2014208989 A1 | 12/2014 |

*Primary Examiner* — Anthony Ho
(74) *Attorney, Agent, or Firm* — Rivka Friedman (57) ABSTRACT

Provided are a display backplane and a mobile terminal. The display backplane includes a plurality of light-emitting units and at least one detection circuit. Each of the light-emitting circuits includes a driving transistor. Each of the detection circuits is electrically connected to source electrodes of the driving transistors in at least two of the light-emitting units, at least for detecting voltages of the source electrodes of the driving transistors in the two corresponding light-emitting unit.

20 Claims, 4 Drawing Sheets

DISPLAY BACKPLANE AND MOBILE TERMINAL

FIELD OF THE INVENTION

The present invention relates to a field of display technology, particular to a technical field of display panel manufacturing and particular to a display backplane and a mobile terminal.

BACKGROUND OF THE INVENTION

Mini LED (Mini Light Emitting Diodes) backlight can match the display screen of the panel to enable the area to turn on the backlight, so as to achieve a million-level contrast.

Mini LEDs are driven by current. The driving transistors used to drive Mini LEDs require a corresponding detection circuit for detection and compensation due to the drift of the charge mobility threshold voltage. However, that each light-emitting unit is equipped with a corresponding detection circuit to detect and compensate for the corresponding driver transistor will result in too many electronic devices in the light-emitting unit and complex circuitry, thus reducing the light transmission rate and circuit yield of the display panel.

Therefore, it is necessary to provide a display backplane and a mobile terminal that can improve the light transmission rate and circuit yield of display panel.

SUMMARY OF THE INVENTION

The embodiments of the present invention provide a display backplane and a mobile terminal to solve the existing problems of low light transmission rate and low circuit yield of the display panel caused by the excessive number of detection circuits.

The embodiment of the present invention provides a display backplane, including:

a plurality of light-emitting units, each of the light-emitting units includes a light-emitting circuit, and each of the light-emitting circuits includes a driving transistor;

at least one detection circuit, each of the detection circuits is electrically connected to source electrodes of the driving transistors in at least two of the light-emitting units, at least for detecting voltages of the source electrodes of the driving transistors in the two corresponding light-emitting units;

wherein when the detection circuit is electrically connected to the plurality of light-emitting units, a switch module is provided between the detection circuit and each of the light-emitting units that are electrically connected to the detection circuit, and the switch module is used to control the conduction between the detection circuit and the corresponding light-emitting units.

In one embodiment, the plurality of light-emitting units includes a plurality of repeating units, and each of the repeating units includes the plurality of light-emitting units arranged as one flock;

wherein the source electrodes of the driving transistors in the plurality of light-emitting units in at least one of the repeating units are electrically connected to the detection circuit.

In one embodiment, the detection circuit includes a detection transistor, a gate electrode of the detection transistor is electrically connected to a detection scan line, a source electrode of the detection transistor is electrically connected to a switching module, and a drain electrode of the detection transistor is electrically connected to the source electrodes of the driving transistors in at least four of the corresponding light-emitting units;

wherein the switching module is used for controlling the source of the detection transistor to be electrically connected to a reference voltage line or a sampling module.

In one embodiment, each of the light-emitting circuit further includes a light-emitting device, and an anode of the light-emitting device is electrically connected to the source electrode of the driving transistor;

wherein when the source electrode of the detection transistor is electrically connected to the sampling module, the plurality of light-emitting devices in the repeating unit that is electrically connected to the detection circuit emit light at the same time or at different times.

In one embodiment, the plurality of the light-emitting units are arranged in an array along a first direction and a second direction, and the display backplane further includes:

a plurality of scan lines, the plurality of scan lines extending along the first direction and aligned along the second direction;

a plurality of data lines, the plurality of data lines extending along the second direction and aligned along the first direction;

wherein each of the light-emitting circuits includes a switch transistor, and a drain electrode of the switch transistor is electrically connected to a gate electrode of the corresponding driving transistor, and each of the scan lines is electrically connected to gate electrodes of the switch transistors in the light-emitting circuits of the plurality of light-emitting units aligned along the first direction, and each of the data lines is electrically connected to source electrodes of the switch transistors in the light-emitting circuits of the plurality of light-emitting units aligned along the second direction.

In one embodiment, each of the repeating units includes four of the light-emitting units arranged in an array along the first direction and the second direction, and the two scan lines electrically connected to the repeating unit are electrically connected.

In one embodiment, the source electrodes of the four driving transistors in the repeating unit electrically connected to the corresponding detection circuit and the corresponding detection circuit are disposed close to a center of the repeating unit.

In one embodiment, the display backplane further includes:

a plurality of ground lines, the plurality of ground lines extending along the first direction and aligned along the second direction;

wherein the four light-emitting circuits in the repeating unit electrically connected to the detection circuit are axisymmetric with respect to a first axis, and the first axis passes through the center of the repeating unit and extends along the first direction, and the ground line electrically connected to the corresponding four light-emitting circuits coincide with the corresponding first axis.

In one embodiment, the two scan lines electrically connected to the repeating unit are located on two opposite sides of the repeating unit, and the two data lines electrically connected to the repeating unit are located on other two opposite sides of the repeating unit.

The embodiment of the present invention provides a display backplane, including:

a plurality of light-emitting units, each of the light-emitting units includes a light-emitting circuit, and each of the light-emitting circuits includes a driving transistor;

at least one detection circuit, each of the detection circuits is electrically connected to source electrodes of the driving transistors in at least two of the light-emitting units, at least for detecting voltages of the source electrodes of the driving transistors in the two corresponding light-emitting units.

In one embodiment, the plurality of light-emitting units includes a plurality of repeating units, and each of the repeating units includes the plurality of light-emitting units arranged as one flock;

wherein the source electrodes of the driving transistors in the plurality of light-emitting units in at least one of the repeating units are electrically connected to the detection circuit.

In one embodiment, the detection circuit includes a detection transistor, a gate electrode of the detection transistor is electrically connected to a detection scan line, a source electrode of the detection transistor is electrically connected to a switching module, and a drain electrode of the detection transistor is electrically connected to the source electrodes of the driving transistors in at least four of the corresponding light-emitting units;

wherein the switching module is used for controlling the source of the detection transistor to be electrically connected to a reference voltage line or a sampling module.

In one embodiment, each of the light-emitting circuit further includes a light-emitting device, and an anode of the light-emitting device is electrically connected to the source electrode of the driving transistor;

wherein when the source electrode of the detection transistor is electrically connected to the sampling module, the plurality of light-emitting devices in the repeating unit that is electrically connected to the detection circuit emit light at the same time or at different times.

In one embodiment, the plurality of the light-emitting units are arranged in an array along a first direction and a second direction, and the display backplane further includes:

a plurality of scan lines, the plurality of scan lines extending along the first direction and aligned along the second direction;

a plurality of data lines, the plurality of data lines extending along the second direction and aligned along the first direction;

wherein each of the light-emitting circuits includes a switch transistor, and a drain electrode of the switch transistor is electrically connected to a gate electrode of the corresponding driving transistor, and each of the scan lines is electrically connected to gate electrodes of the switch transistors in the light-emitting circuits of the plurality of light-emitting units aligned along the first direction, and each of the data lines is electrically connected to source electrodes of the switch transistors in the light-emitting circuits of the plurality of light-emitting units aligned along the second direction.

In one embodiment, each of the repeating units includes four of the light-emitting units arranged in an array along the first direction and the second direction, and the two scan lines electrically connected to the repeating unit are electrically connected.

In one embodiment, the source electrodes of the four driving transistors in the repeating unit electrically connected to the corresponding detection circuit and the corresponding detection circuit are disposed close to a center of the repeating unit.

In one embodiment, the display backplane further includes:

a plurality of ground lines, the plurality of ground lines extending along the first direction and aligned along the second direction;

wherein the four light-emitting circuits in the repeating unit electrically connected to the detection circuit are axisymmetric with respect to a first axis, and the first axis passes through the center of the repeating unit and extends along the first direction, and the ground line electrically connected to the corresponding four light-emitting circuits coincide with the corresponding first axis.

In one embodiment, the two scan lines electrically connected to the repeating unit are located on two opposite sides of the repeating unit, and the two data lines electrically connected to the repeating unit are located on other two opposite sides of the repeating unit.

In one embodiment, the display backplane further includes:

a plurality of operating voltage lines, the plurality of operating voltage lines extending along the second direction and aligned along the first direction;

wherein in the repeating unit, the operating voltage lines electrically connected to the four corresponding light-emitting circuits are located between two adjacent light-emitting circuits aligned along the first direction.

The embodiment of the present invention provides a mobile terminal. The mobile terminal includes a terminal main body and any of the display panels as described above, and the terminal main body and the display panel are combined into one body.

The present invention provides a display backplane and a mobile terminal. The display backplane includes each of the light-emitting units includes a light-emitting circuit, and each of the light-emitting circuits includes a driving transistor; at least one detection circuit, each of the detection circuits is electrically connected to source electrodes of the driving transistors in at least two of the light-emitting units, at least for detecting voltages of the source electrodes of the driving transistors in the two corresponding light-emitting units. In the present invention, the detection circuit is electrically connected to the source electrodes of the driving transistors in at least two of the light-emitting units to detect at least two of the light-emitting units to avoid setting the corresponding detection circuit in each of the light-emitting units. The number of detection circuits is effectively reduced, so as to reduce the number of electronic devices in the light-emitting unit and reduce the circuitry complexity, thereby improving the light transmission rate and the circuit yield of the display panel.

BRIEF DESCRIPTION OF THE DRAWINGS

The technical solution and the beneficial effects of the present application are best understood from the following detailed description with reference to the accompanying figures and embodiments.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are merely part of embodiments of the present invention, but not all embodiments. Based on the embodiments of the present invention, all other embodiments to those of skilled in the premise of no creative efforts obtained, should be considered within the scope of protection of the present invention.

The terminologies "first" and "second" in the present invention are used for distinguishing different objects but not for describing the specific sequence. Furthermore, the terms "including" and "having" and their any deformations are intended to cover non-exclusive inclusion. For example, a process, a method, a system, a product or a device comprising a series of steps or units which is not limited to the steps or units already listed, but optionally further comprises steps or units which are not listed, or optionally further comprises other steps or units which are inherent in these the process, the method, the product or the device.

Reference in this specification to "embodiment" means that a particular feature, structure, or characteristic described in connection with the embodiment is included in at least one embodiment of the present invention. Appearances of the phrase "embodiment" in various places in the specification do not necessarily refer to the same embodiment, nor are separate or alternative embodiments mutually exclusive of other embodiments. Those skilled in the art implicitly and explicitly understand that the embodiments described herein may be combined with other embodiments.

The embodiment of the present invention provides a display backplane, and the display backplane includes but is not limited to the following embodiments and a combination of the following embodiments.

Figure 1:
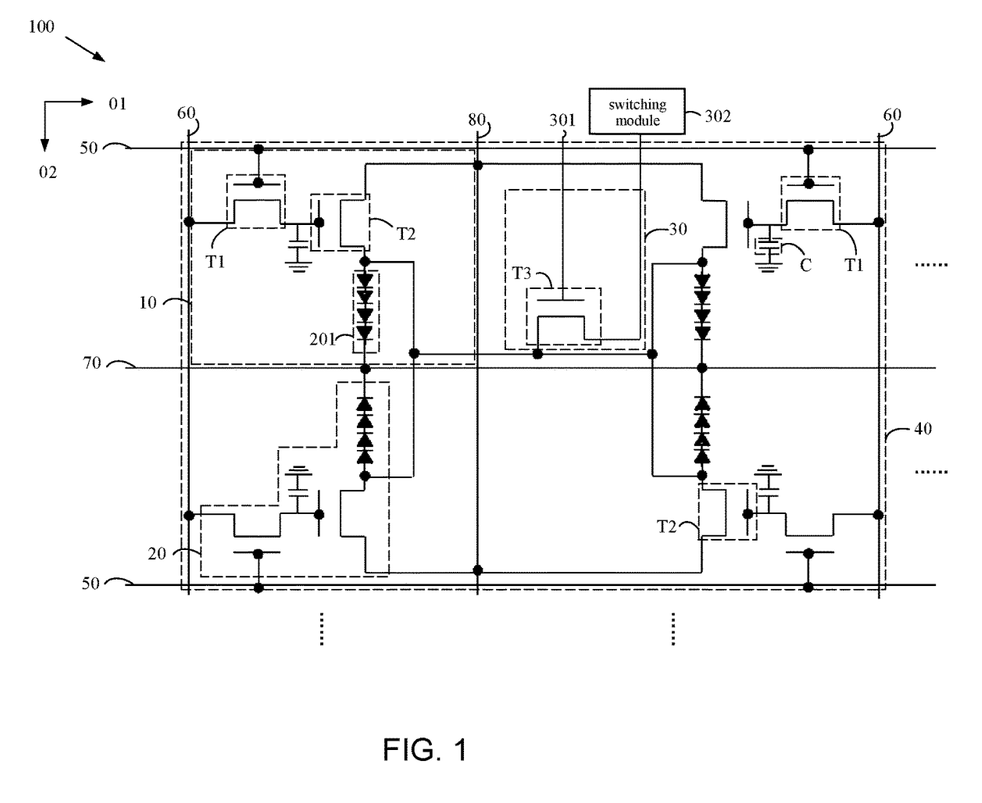
FIG. 1 is a circuit diagram of a display backplane provided by an embodiment of the present invention.

In one embodiment, as shown in FIG. 1, the display backplane 100 includes: a plurality of light-emitting units 10, each of the light-emitting units 10 includes a light-emitting circuit 20, and each of the light-emitting circuits 20 includes a driving transistor T2; at least one detection circuit 30, each of the detection circuits 30 is electrically connected to source electrodes of the driving transistors T2 in at least two of the light-emitting units 10, at least for detecting voltages of the source electrodes of the driving transistors T2 in the two corresponding light-emitting units 10.

The plurality of light-emitting units 10 may be aligned in one direction, or may be divergently aligned in multiple directions. Furthermore, the plurality of the light-emitting units 10 may be aligned in two directions perpendicular to each other to form a matrix arrangement. Here, a number of the light-emitting units 10 may be related to a size of the display backplane 100.

Specifically, the detection circuit 30 may be located at an edge area of the display backplane 100 to avoid reducing the utilization rate of the light emitted by the plurality of light-emitting units 10, and the detection circuit 30 may be electrically connected to the source electrodes of the driving transistors T2 in at least two of the light-emitting units 10 through connecting wires; furthermore, the detection circuit 30 may be electrically connected to the source electrodes of the driving transistors T2 in at least two of the light-emitting units 10 near the edge area of the display backplane 100, so as to shorten paths of the detection circuit 30 and the source electrodes of the at least two driving transistors T2, thereby improving the reliability of detection. Specifically, the position of the detection circuit 30 may also be determined according to the positions of the source electrodes of the driving transistors T2 in the at least two light-emitting units 10 that are electrically connected to the detection circuit 30. The detection circuit 30 may be located in an area close to the source electrodes of the at least two driving transistors T2, so as to improve the reliability of detection.

Figure 2:
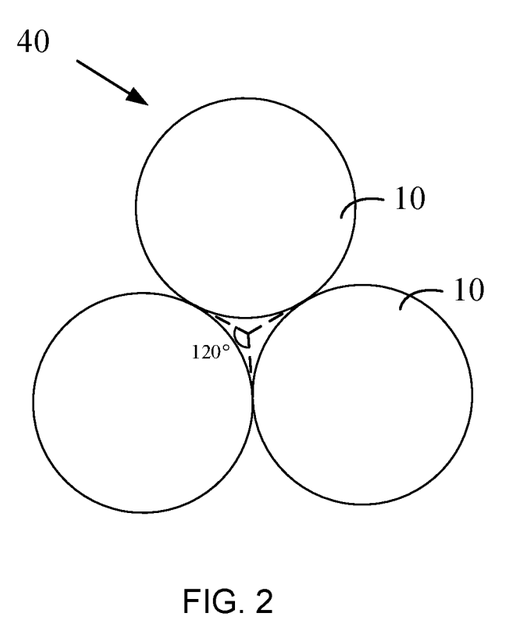
FIG. 2 is a schematic diagram of an arrangement of light-emitting units according to an embodiment of the present invention.
Figure 3:
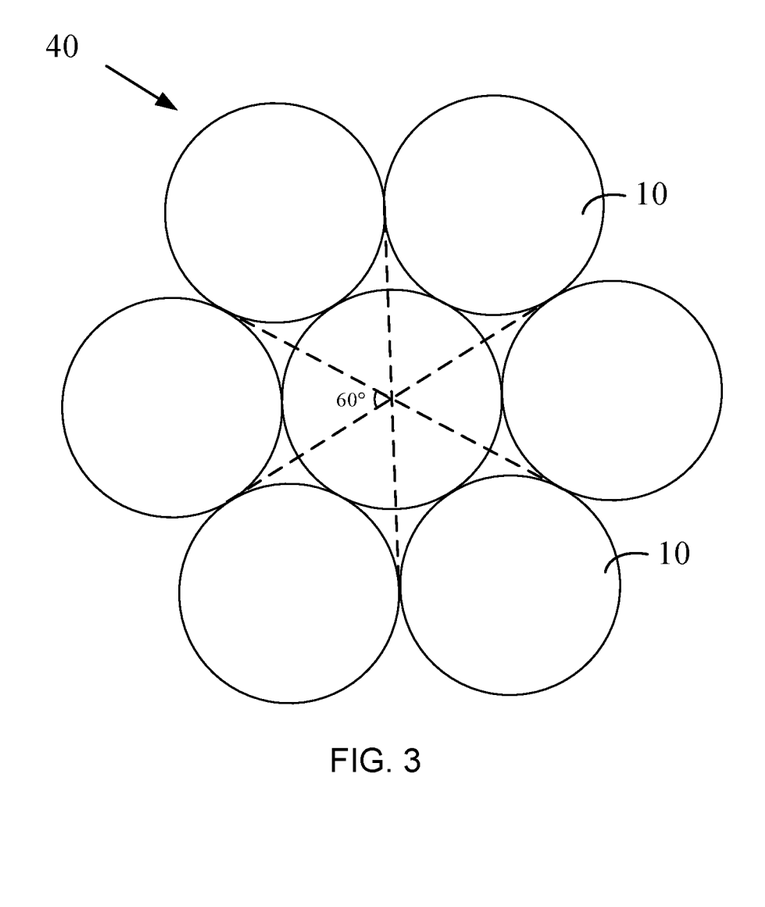
FIG. 3 is a schematic diagram of another arrangement of light-emitting units according to an embodiment of the present invention.

In one embodiment, as shown in FIG. 1 to FIG. 3, the plurality of light-emitting units 10 includes a plurality of repeating units 40, and each of the repeating units 40 includes the plurality of light-emitting units 10 arranged as one flock; wherein the source electrodes of the driving transistors T2 in the plurality of light-emitting units 10 in at least one of the repeating units 40 are electrically connected to the detection circuit 30.

Figure 4:
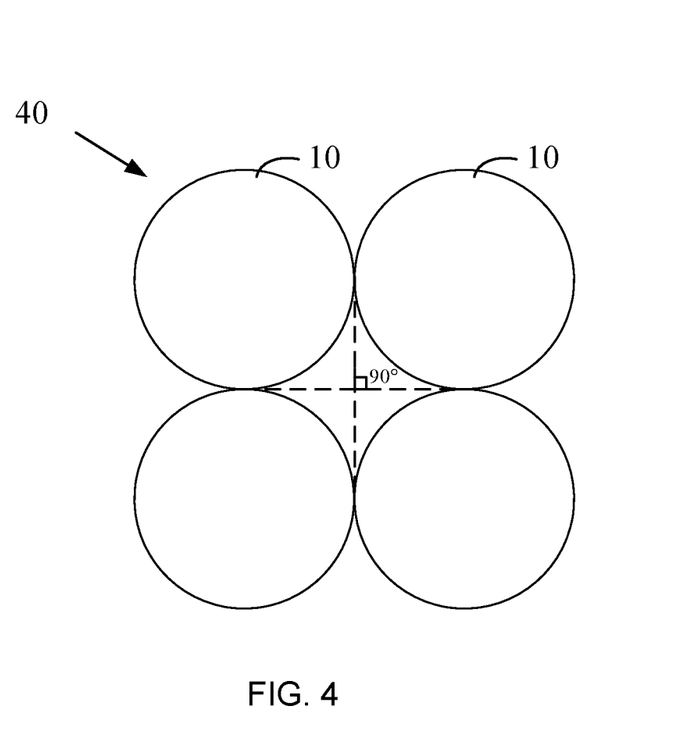
FIG. 4 is a schematic diagram of one another arrangement of light-emitting units according to an embodiment of the present invention.

A plurality of the light-emitting units 10 may be composed of a plurality of the repeating units 40, or a part of the light-emitting units 10 may be composed of a plurality of the repeating units 40, and another part of the light-emitting units 10 may be arranged in other ways. Specifically, the plurality of light-emitting units 10 in each of the repeating units 40 can be continuously arranged to avoid any gap between any two adjacent light-emitting units 10. As shown in FIG. 2 to FIG. 4, two adjacent light-emitting units 10 in the repeating unit 40 can be arranged in contact so that the plurality of light-emitting units 10 in the repeating unit 40 are distributed in a concentrated manner. Here, only the circular shape of the plurality of light-emitting units 10 in the repeating unit 40 is taken as an example for drawing description.

It is understandable that the arrangement of the plurality of light-emitting units 10 in the repeating unit 40 may also be related to a shape of the light-emitting units 10, and specifically may be related to an included angle of the light-emitting units 10. Combining FIG. 1 and FIG. 4, it can be seen that when the light-emitting units 10 are rectangular, the repeating unit 40 may also include four light-emitting units 10 arranged in an array. Similarly, the repeating unit 40 in FIG. 2 may also include three light-emitting units 10 with an included angle of 120° in a center-symmetric arrangement. The repeating unit 40 in FIG. 3 may also include six light-emitting units 10 with an included angle of 60° in a center-symmetric arrangement.

It should be noted that for the plurality of the repeating units 40, it is only necessary that the source electrodes of the driving transistors T2 in one or more of the repeating units 40 are electrically connected to one of the detection circuits 30. In the other repeating units 40, the source electrodes of one, two or three of the driving transistors T2 in each of the repeating units 40 may be electrically connected to one of the detecting circuits 30. Or, the source electrodes of at least two driving transistors T2 in different repeating units 40 may be electrically connected to one of the detecting circuits 30.

It is understandable that in this embodiment, since a plurality of the light-emitting units 10 are continuously arranged as one repeating unit 40, electrically connecting the detection circuit 30 to one of the repeating units 40 can not only save the number of the detection circuits 30, but also it can avoid the paths of the detection circuit 30 and the plurality of light-emitting units 10 from being scattered, and can shorten the total length of the paths of the detection circuit 30 and the plurality of light-emitting units 10 because the plurality of light-emitting units 10 in the repeating unit 40 are arranged more concentratedly, thereby improving the reliability of detection.

In one embodiment, as shown in FIG. 1, the detection circuit 30 includes a detection transistor T3, a gate electrode of the detection transistor T3 is electrically connected to a detection scan line 301, a source electrode of the detection transistor T3 is electrically connected to a switching module 302, and a drain electrode of the detection transistor T3 is electrically connected to the source electrodes of the driving transistors T2 in at least four of the corresponding light-emitting units 10; wherein the switching module 302 is used for controlling the source of the detection transistor 30 to be electrically connected to a reference voltage line or a sampling module.

Specifically, the electrical signal in the detection scan line 301 can control the activation of the detection transistor T3. Further, in a reset phase, the switching module 302 can control the source electrode of the detection transistor T3 to be electrically connected to the reference voltage line, so that the electrical signal in the reference voltage line is loaded to the source electrode of the driving transistor T2 through the detection transistor T3 for resetting. In a detection phase, the switching module 302 can control the source electrode of the detection transistor T3 to be electrically connected to the sampling module, so that the sampling module collects the voltage value of the source electrode of the driving transistor T2 through the detection transistor T3. The switching module 302 may include, but is not limited to, a plurality of transistors.

In one embodiment, each of the light-emitting circuit 20 further includes a light-emitting device 201, and an anode of the light-emitting device 201 is electrically connected to the source electrode of the driving transistor T2; wherein when the source electrode of the detection transistor T3 is electrically connected to the sampling module, the plurality of light-emitting devices 201 in the repeating unit 40 that is electrically connected to the detection circuit 30 emit light at the same time or at different times.

It should be noted that the detection phase occurs in at least one corresponding light-emitting device 201, which emits light. Specifically, when the light-emitting device 201 emits light, the corresponding sampling module can collect the voltage value of the source electrode of the driving transistor T2 in real time through the corresponding detection circuit 30. Further, the voltage value of the source electrode of the driving transistor T2 may be compared with a preset voltage value, so as to compensate the driving transistor T2.

It can be understood that when at least two of the light-emitting devices 201 in the plurality of light-emitting devices 201 in the repeating unit 40 electrically connected to the detection circuit 30 emit light, the voltages of the anodes of the at least two of the light-emitting devices 201, which emit light may be the same or different, and finally a target voltage value appears at the drain electrode of the detection transistor T3. The sampling module may collect the target voltage value as the voltage values of the anodes of the at least two light-emitting devices 201 that emit light through the detection transistor T3, and can perform the same compensation for the at least two light-emitting devices 201 that emit light according to the target voltage value. Certainly, when the plurality of light-emitting devices 201 in the repeating unit 40 electrically connected to the detection circuit 30 do not emit light at the same time, the sampling module can collect the voltage value of the anode of one light-emitting device 201 through the detection transistor T3 when the one light-emitting devices 201 emits light, and compensate the light-emitting device 201 thereby, and so on. The aforesaid operation can also be performed on the light-emitting device 201 that emits light at a subsequent time.

Furthermore, a switch module is provided between the detection circuit 30 and each of the light-emitting devices 201 that are electrically connected to the detection circuit 30, and the switch module is used to control the conduction between the detection circuit 30 and the corresponding light-emitting devices 201. It can be understood that when at least two of the light-emitting devices 201 in the plurality of light-emitting devices 201 in the repeating unit 40 electrically connected to the detection circuit 30 emit light, a plurality of switch modules can be controlled to connect the detection circuit 30 with different light-emitting devices 201 at different times, so that the voltage values of the anodes of the corresponding light-emitting devices 201 can be collected at different times to compensate the corresponding driving transistors T2. It is avoided that only one target voltage value can be collected, which improves the reliability of detection and the reliability of compensation.

In one embodiment, as shown in FIG. 1, the plurality of the light-emitting units 10 are arranged in an array along a first direction 01 and a second direction 02. The display backplane 100 further includes: a plurality of scan lines 50, the plurality of scan lines 50 extending along the first direction 01 and aligned along the second direction 02; a plurality of data lines 60, the plurality of data lines 60 extending along the second direction 02 and aligned along the first direction 01; wherein each of the light-emitting circuits 20 includes a switch transistor T1, and a drain electrode of the switch transistor T1 is electrically connected to a gate electrode of the corresponding driving transistor T2, and each of the scan lines 50 is electrically connected to gate electrodes of the switch transistors T1 in the light-emitting circuits 20 of the plurality of light-emitting units 10 aligned along the first direction 01, and each of the data lines 60 is electrically connected to source electrodes of the switch transistors T1 in the light-emitting circuits 20 of the plurality of light-emitting units 10 aligned along the second direction 02.

It should be noted that, for ease of description, it is temporarily understood that multiple rows of the light-emitting units 10 are arranged along the second direction 02, and multiple columns of the light-emitting units 10 are arranged along the first direction 01. Specifically, the electrical signals in the plurality of scan lines 50 may be different, so as to control the switch transistors T1 in the multiple rows of the light-emitting units 10 to be turned on at different moments; the electrical signals in the plurality of data lines 60 may be the same or different. When the switch transistors T1 in one row of the light-emitting units 10 are turned on, the electrical signals in the plurality of data lines 60 are loaded to the gate electrodes of the driving transistors T2 respectively through the corresponding plurality of the switch transistors T1.

As shown in FIG. 1, for one light-emitting unit 10, in a writing phase, the electrical signal in the scan line 50 controls the switch transistor T1 to be turned on, and at the same time, the electrical signal in the data line 60 is loaded to the gate electrode of the driving transistor T2 through the switch transistor T1; further, the gate electrode of the driving transistor T2 is also electrically connected to one end of a capacitor C, and the other end of the capacitor C may be grounded or electrically connected to the source electrode of the driving transistor T2. When the switch transistor T1 is turned off, the capacitor C can maintain the voltage of the gate electrode of the driving transistor T2 to be similar to the electrical signal in the data line 60.

In one embodiment, each of the repeating units 40 includes four of the light-emitting units 10, arranged in an array along the first direction 01 and the second direction 02, and the two scan lines 50 electrically connected to the repeating unit 40 are electrically connected.

It can be understood that the plurality of light-emitting units 10 are arranged in an array along the first direction 01 and the second direction 02, so that each of the repeating units 40 includes four or more of the light-emitting units 10, arranged in an array along the first direction 01 and the second direction 02. Specifically, since four light-emitting units 10 are continuously arranged as one repeating unit 40, and 4 is the minimum number that is greater than 1 and can be arranged in a matrix. Thus, electrically connecting the detection circuit 30 to one of the repeating units 40 can not only save the number of the detection circuits 30, but also it can avoid the paths of the detection circuit 30 and the four light-emitting units 10 from being scattered, and can shorten the total length of the paths of the detection circuit 30 and the four light-emitting units 10 because the four light-emitting units 10 in the repeating unit 40 are arranged more concentratedly, thereby improving the reliability of detection.

As aforementioned, the electrical signals in the plurality of scan lines 50 are different, so as to control the switch transistors T1 in the multiple rows of the light-emitting units 10 to be turned on at different moments; then, in this embodiment, by electrically connecting the two scan lines 50 that are electrically connected to the repeating unit 40, the four switch transistors T1 that are electrically connected to the repeating unit 40 can be turned on at the same time, so that the four corresponding light-emitting devices 201 can emit light at the same time. Therefore, the anode voltages of the four corresponding light-emitting devices 201 can be collected as the corresponding target voltage value at the same time, so as to improve the efficiency of detection.

In one embodiment, as shown in FIG. 1, the source electrodes of the four driving transistors T2 in the repeating unit 40 electrically connected to the corresponding detection circuit 30 and the corresponding detection circuit 30 are disposed close to a center of the repeating unit 40.

It can be understood that the four light-emitting units 10 in the repeating unit 40 are arranged in an array, that is, the distance between the center of the repeating unit 40 and each of the light-emitting circuits 20 can be small. Thus, arranging the corresponding detection circuit 30 close to the center of the repeating unit 40 can make the distance between the detection circuit 30 and the source electrodes of the four corresponding driving transistors T2 smaller; further, arranging the source electrodes of the four corresponding driving transistors T2 close to the center of the repeating unit 40 can shorten the distance between the source electrode of each of the driving transistors T2 and the corresponding detection circuit 30. Therefore, in this embodiment, by reasonably setting the positions of the detection circuit 30 and the source electrodes of the four driving transistors T2 in the repeating unit 40, the total length of the paths of the detection circuit 30 and the four light-emitting units 10 are shortened, thereby improving the reliability of detection.

In one embodiment, as shown in FIG. 1, the display backplane 100 further includes: a plurality of ground lines 70, the plurality of ground lines 70 extending along the first direction 01 and aligned along the second direction 20; wherein the four light-emitting circuits 20 in the repeating unit 40 electrically connected to the detection circuit 30 are axisymmetric with respect to a first axis, and the first axis passes through the center of the repeating unit 40 and extends along the first direction 01, and the ground line 70 electrically connected to the corresponding four light-emitting circuits 20 coincide with the corresponding first axis.

Specifically, as shown in FIG. 1, the first axis can be understood as the symmetric axis of the corresponding repeating units 40 in the first direction 01, that is, the ground line 70 can equally divide the repeating units 40 in the second direction 02. Namely, the four light-emitting circuits 20 electrically connected to the same ground line 70 may be distributed symmetrically with respect to the ground line 70. Furthermore, the four corresponding light-emitting devices 201 may be distributed symmetrically with respect to the ground line 70. Since the cathodes of the four corresponding light-emitting devices 201 can be electrically connected to the ground line 70, the cathodes of the four light-emitting devices 201 can be arranged close to the corresponding ground line 70. Furthermore, each of the light-emitting devices 201 may include a plurality of organic light-emitting semiconductors connected in series or a plurality of light-emitting diodes connected in series, and the plurality of organic light-emitting semiconductors connected in series or the plurality of light-emitting diodes connected in series may be arranged along the second direction 02.

Furthermore, the display backplane 100 further includes: a plurality of operating voltage lines 80, the plurality of operating voltage lines 80 extending along the second direction 02 and aligned along the first direction 01; wherein in the repeating unit 40, the operating voltage lines 80 electrically connected to the four corresponding light-emitting circuits 20 are located between two adjacent light-emitting circuits 20 aligned along the first direction 01. Specifically, after each of the operating voltage lines 80 and each of the ground lines 70 intersect, the boundaries of the corresponding repeating unit 40 will form four regions. The detection circuit 30 electrically connected to the corresponding repeating unit 40 can be located in any of the four regions, that is, the detection circuit 30 can be disposed close to any of the light-emitting circuits 20.

The writing phase may be arranged between the reset phase and the detection phase; the ground line 70 may be grounded, and the drain electrode of the driving transistor T2 may be electrically connected to the corresponding operating voltage line 80. Namely, after the writing phase is over, the driving transistor T2 may be turned on, and the electrical signal in the operating voltage line 80 is loaded to the anode of the light-emitting device 201 through the driving transistor T2, so that the light-emitting device 201 emits light to enter a light-emitting phase.

In one embodiment, as shown in FIG. 1, the two scan lines 50 electrically connected to the repeating unit 40 are located on two opposite sides of the repeating unit 40, and the two data lines 60 electrically connected to the repeating unit 40 are located on other two opposite sides of the repeating unit 40.

It can be understood that as aforementioned, for the repeating unit 40, the corresponding ground line 70 is located between the two light-emitting circuits 20 arranged along the second direction 02, and the corresponding operating voltage line 80 is located between the two light-emitting circuits 20 arranged along the first direction 01. The two corresponding scan lines 50 and the two corresponding data lines 60 are arranged at the edges of the repeating unit 40. In the case that the ground line 70 and the operating voltage line 80 are shared, the signal interference of the two scan lines 50 to the ground line 70 can be avoided, and the signal interference of the two data lines 60 to the signal of the voltage line 80 can be avoided.

The embodiment of the present invention provides a display panel. The display panel includes a backlight panel. The back plate includes any of the display backplanes as described above. Specifically, the display backplane can be understood as a thin film transistor array. The display panel in this embodiment may further include a pixel layer, a liquid crystal layer, and a color film layer on the backlight panel. The backlight panel may be made of any of the display backplanes described above, and the display panel in this embodiment may be a liquid crystal display panel.

The embodiment of the present invention provides a display panel. The display panel includes a pixel layer. The pixel layer may be any of the pixel layers as described above. Specifically, the display panel in this embodiment may be a self-luminous display panel made of organic light-emitting semiconductors, that is, the display panel in this embodiment may not require a backlight panel. The display backplane may be understood as a thin film transistor array, and a light-emitting layer may be provided on the display backplane, and the light-emitting layer may include, but is not limited to, an organic light-emitting semiconductor device.

The embodiment of the present invention provides a mobile terminal. The mobile terminal includes a terminal main body and any of the display panels as described above, and the terminal main body and the display panel are combined into one body.

The present invention provides a display backplane and a mobile terminal. The display backplane includes each of the light-emitting units includes a light-emitting circuit, and each of the light-emitting circuits includes a driving transistor; at least one detection circuit, each of the detection circuits is electrically connected to source electrodes of the driving transistors in at least two of the light-emitting units, at least for detecting voltages of the source electrodes of the driving transistors in the two corresponding light-emitting units. In the present invention, the detection circuit is electrically connected to the source electrodes of the driving transistors in at least two of the light-emitting units to detect at least two of the light-emitting units to avoid setting the corresponding detection circuit in each of the light-emitting units. The number of detection circuits is effectively reduced, so as to reduce the number of electronic devices in the light-emitting unit and reduce the circuitry complexity, thereby improving the light transmission rate and the circuit yield of the display panel.

The display backplane and the mobile device provided by the embodiments of the present application is described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

What is claimed is:

1. A display backplane, including:
a plurality of light-emitting units, each of the light-emitting units includes a light-emitting circuit, and each of the light-emitting circuits includes a driving transistor;
at least one detection circuit, each of the detection circuits is electrically connected to source electrodes of the driving transistors in at least two of the light-emitting units, at least for detecting voltages of the source electrodes of the driving transistors in the two corresponding light-emitting units;
wherein when the detection circuit is electrically connected to the plurality of light-emitting units, a switch module is provided between the detection circuit and each of the light-emitting units that are electrically connected to the detection circuit, and the switch module is used to control the conduction between the detection circuit and the corresponding light-emitting units.

2. The display backplane according to claim 1, wherein the plurality of light-emitting units includes a plurality of repeating units, and each of the repeating units includes the plurality of light-emitting units arranged as one flock;
wherein the source electrodes of the driving transistors in the plurality of light-emitting units in at least one of the repeating units are electrically connected to the detection circuit.

3. The display backplane according to claim 2, wherein the detection circuit includes a detection transistor, a gate electrode of the detection transistor is electrically connected to a detection scan line, a source electrode of the detection transistor is electrically connected to a switching module, and a drain electrode of the detection transistor is electrically connected to the source electrodes of the driving transistors in at least four of the corresponding light-emitting units;
wherein the switching module is used for controlling the source of the detection transistor to be electrically connected to a reference voltage line or a sampling module.

4. The display backplane according to claim 3, wherein each of the light-emitting circuit further includes a light-emitting device, and an anode of the light-emitting device is electrically connected to the source electrode of the driving transistor;
wherein when the source electrode of the detection transistor is electrically connected to the sampling module, the plurality of light-emitting devices in the repeating unit that is electrically connected to the detection circuit emit light at the same time or at different times.

5. The display backplane according to claim 2, wherein the plurality of the light-emitting units are arranged in an array along a first direction and a second direction, and the display backplane further includes:
a plurality of scan lines, the plurality of scan lines extending along the first direction and aligned along the second direction;
a plurality of data lines, the plurality of data lines extending along the second direction and aligned along the first direction;
wherein each of the light-emitting circuits includes a switch transistor, and a drain electrode of the switch transistor is electrically connected to a gate electrode of the corresponding driving transistor, and each of the scan lines is electrically connected to gate electrodes of the switch transistors in the light-emitting circuits of the plurality of light-emitting units aligned along the first direction, and each of the data lines is electrically connected to source electrodes of the switch transistors in the light-emitting circuits of the plurality of light-emitting units aligned along the second direction.

6. The display backplane according to claim 5, wherein each of the repeating units includes four of the light-emitting units arranged in an array along the first direction and the second direction, and the two scan lines electrically connected to the repeating unit are electrically connected.

7. The display backplane according to claim 5, wherein the source electrodes of the four driving transistors in the repeating unit electrically connected to the corresponding detection circuit and the corresponding detection circuit are disposed close to a center of the repeating unit.

8. The display backplane according to claim 7, wherein the display backplane further includes:
a plurality of ground lines, the plurality of ground lines extending along the first direction and aligned along the second direction;
wherein the four light-emitting circuits in the repeating unit electrically connected to the detection circuit are axisymmetric with respect to a first axis, and the first axis passes through the center of the repeating unit and extends along the first direction, and the ground line electrically connected to the corresponding four light-emitting circuits coincide with the corresponding first axis.

9. The display backplane according to claim 8, wherein the two scan lines electrically connected to the repeating unit are located on two opposite sides of the repeating unit, and the two data lines electrically connected to the repeating unit are located on other two opposite sides of the repeating unit.

10. A display backplane, including:
a plurality of light-emitting units, each of the light-emitting units includes a light-emitting circuit, and each of the light-emitting circuits includes a driving transistor;
at least one detection circuit, each of the detection circuits is electrically connected to source electrodes of the driving transistors in at least two of the light-emitting units, at least for detecting voltages of the source electrodes of the driving transistors in the two corresponding light-emitting units.

11. The display backplane according to claim 10, wherein the plurality of light-emitting units includes a plurality of repeating units, and each of the repeating units includes the plurality of light-emitting units arranged as one flock;
wherein the source electrodes of the driving transistors in the plurality of light-emitting units in at least one of the repeating units are electrically connected to the detection circuit.

12. The display backplane according to claim 11, wherein the detection circuit includes a detection transistor, a gate electrode of the detection transistor is electrically connected to a detection scan line, a source electrode of the detection transistor is electrically connected to a switching module, and a drain electrode of the detection transistor is electrically connected to the source electrodes of the driving transistors in at least four of the corresponding light-emitting units;
wherein the switching module is used for controlling the source of the detection transistor to be electrically connected to a reference voltage line or a sampling module.

13. The display backplane according to claim 12, wherein each of the light-emitting circuit further includes a light-emitting device, and an anode of the light-emitting device is electrically connected to the source electrode of the driving transistor;
wherein when the source electrode of the detection transistor is electrically connected to the sampling module, the plurality of light-emitting devices in the repeating unit that is electrically connected to the detection circuit emit light at the same time or at different times.

14. The display backplane according to claim 11, wherein the plurality of the light-emitting units are arranged in an array along a first direction and a second direction, and the display backplane further includes:
a plurality of scan lines, the plurality of scan lines extending along the first direction and aligned along the second direction;
a plurality of data lines, the plurality of data lines extending along the second direction and aligned along the first direction;
wherein each of the light-emitting circuits includes a switch transistor, and a drain electrode of the switch transistor is electrically connected to a gate electrode of the corresponding driving transistor, and each of the scan lines is electrically connected to gate electrodes of the switch transistors in the light-emitting circuits of the plurality of light-emitting units aligned along the first direction, and each of the data lines is electrically connected to source electrodes of the switch transistors in the light-emitting circuits of the plurality of light-emitting units aligned along the second direction.

15. The display backplane according to claim 14, wherein each of the repeating units includes four of the light-emitting units arranged in an array along the first direction and the second direction, and the two scan lines electrically connected to the repeating unit are electrically connected.

16. The display backplane according to claim 14, wherein the source electrodes of the four driving transistors in the repeating unit electrically connected to the corresponding detection circuit and the corresponding detection circuit are disposed close to a center of the repeating unit.

17. The display backplane according to claim 16, wherein the display backplane further includes:
a plurality of ground lines, the plurality of ground lines extending along the first direction and aligned along the second direction;
wherein the four light-emitting circuits in the repeating unit electrically connected to the detection circuit are axisymmetric with respect to a first axis, and the first axis passes through the center of the repeating unit and extends along the first direction, and the ground line electrically connected to the corresponding four light-emitting circuits coincide with the corresponding first axis.

18. The display backplane according to claim 17, wherein the two scan lines electrically connected to the repeating unit are located on two opposite sides of the repeating unit, and the two data lines electrically connected to the repeating unit are located on other two opposite sides of the repeating unit.

19. The display backplane according to claim 14, wherein the display backplane further includes:
a plurality of operating voltage lines, the plurality of operating voltage lines extending along the second direction and aligned along the first direction;
wherein in the repeating unit, the operating voltage lines electrically connected to the four corresponding light-emitting circuits are located between two adjacent light-emitting circuits aligned along the first direction.

20. A mobile terminal, wherein the mobile terminal includes a terminal main body and the display backplane according to any one of claim 10, and the terminal main body and the display backplane are combined into one body.

* * * * *